United States Patent
Yu et al.

(10) Patent No.: US 12,147,134 B2
(45) Date of Patent: Nov. 19, 2024

(54) ARRAY SUBSTRATE, LIQUID CRYSTAL DISPLAY PANEL AND LIQUID CRYSTAL DISPLAY DEVICE

(71) Applicant: BOE Technology Group Co., Ltd., Beijing (CN)

(72) Inventors: Meina Yu, Beijing (CN); Zheng Fang, Beijing (CN); Hyunsic Choi, Beijing (CN); Pengxia Liang, Beijing (CN); Xiaochuan Chen, Beijing (CN); Hui Zhang, Beijing (CN); Liwei Liu, Beijing (CN); Changfeng Li, Beijing (CN); Fuqiang Li, Beijing (CN); Yuyao Wang, Beijing (CN); Ge Shi, Beijing (CN); Jiahui Han, Beijing (CN); Song Yang, Beijing (CN); Yujie Liu, Beijing (CN); Shiyu Zhang, Beijing (CN); Yanliu Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/922,533

(22) PCT Filed: Jun. 8, 2021

(86) PCT No.: PCT/CN2021/098816
§ 371 (c)(1),
(2) Date: Oct. 31, 2022

(87) PCT Pub. No.: WO2022/022071
PCT Pub. Date: Feb. 3, 2022

(65) Prior Publication Data
US 2023/0168553 A1    Jun. 1, 2023

(30) Foreign Application Priority Data
Jul. 29, 2020 (CN) .......................... 202010741256.3

(51) Int. Cl.
G02F 1/1362 (2006.01)
H01L 27/12 (2006.01)

(52) U.S. Cl.
CPC .. G02F 1/136286 (2013.01); G02F 1/136209 (2013.01); G02F 1/136222 (2021.01); H01L 27/124 (2013.01)

(58) Field of Classification Search
CPC ................................................ G02F 1/136286
See application file for complete search history.

(56) References Cited

U.S. PATENT DOCUMENTS

2009/0251654 A1* 10/2009 Itou .................... G02F 1/134363
    349/141
2016/0041439 A1*  2/2016 Sakai ................... G02F 1/13394
    349/43

* cited by examiner

Primary Examiner — Edmond C Lau
(74) Attorney, Agent, or Firm — Nath, Goldberg & Meyer; Joshua B. Goldberg

(57) ABSTRACT

The present disclosure provides an array substrate, a liquid crystal display panel and a liquid crystal display device, including: a base substrate; gate lines each extending in a first direction on the base substrate; data lines each extending in a second direction intersecting the first direction; pixel units located in regions defined by the gate lines and the data lines; each pixel unit has a first side and a second side each extending in the second direction and opposite to each other in the first direction; each pixel unit includes a first electrode including a plurality of strip-shaped electrodes, at least part of the strip-shaped electrodes each have a first part and a second part extending in different directions, first parts are connected at the first side, second parts are disconnected at the second side, and lengths of the first part and the second part are different.

20 Claims, 13 Drawing Sheets

ARRAY SUBSTRATE, LIQUID CRYSTAL DISPLAY PANEL AND LIQUID CRYSTAL DISPLAY DEVICE

CROSS REFERENCE TO RELATED APPLICATIONS

This is a National Phase Application filed under 35 U.S.C. 371 as a national stage of PCT/CN2021/098816, filed Jun. 8, 2021, which claims priority of Chinese patent application No. 202010741256.3, entitled "Array substrate, Liquid crystal display panel, and Liquid crystal display device" and filed to Chinese patent office on Jul. 29, 2020, each of which is incorporated herein by reference in its entirety.

TECHNICAL FIELD

The present disclosure relates to the field of display technology, and in particular, to an array substrate, a liquid crystal display panel, and a liquid crystal display device.

BACKGROUND

Due to advantages such as light weight, low power consumption, low radiation, and portability, Liquid Crystal Display devices (LCDs) are widely used in modern information devices such as displays, televisions, mobile phones, digital products, and the like. A main structure of a liquid crystal display device consists of an array substrate, a color filter substrate and a liquid crystal layer filled between the array substrate and the color filter substrate.

SUMMARY

In an aspect, an embodiment of the present disclosure provides an array substrate, including:
  a base substrate;
  a plurality of gate lines each extending in a first direction on the base substrate;
  a plurality of data lines each extending in a second direction intersecting the first direction;
  a plurality of pixel units located in regions defined by the f gate lines and the data lines, each of the pixel units has a first side and a second side each extending in the second direction and opposite to each other in the first direction;
  each of the pixel units includes a first electrode,
  the first electrode includes a plurality of strip-shaped electrodes, at least part of the strip-shaped electrodes each have a first part and a second part extending in different directions, first parts are connected at the first side, second parts are disconnected at the second side, and lengths of the first part and the second part are different.

In some implementations, in the array substrate provided by the embodiment of the present disclosure, an included angle between the direction in which each first part extends and the direction in which each second part extends is greater than about 0° and less than or equal to about 45°.

In some implementations, in the array substrate provided by the embodiment of the present disclosure, an included angle between the direction in which each first part extends and the direction in which each second part extends is greater than or equal to about 100 and less than or equal to about 15°.

In some implementations, in the array substrate provided by the embodiment of the present disclosure, the length of each second part is greater than or equal to about 1 μm and less than or equal to about 3 μm.

In some implementations, in the array substrate provided by the embodiment of the present disclosure, each first part is in a shape of a straight line, and each second part is in a shape of a curved line that is curved away from the direction in which each first part extends.

In some implementations, in the array substrate provided by the embodiment of the present disclosure, at least a portion of the second parts have a same radian.

In some implementations, in the array substrate provided by the embodiment of the present disclosure, a line width of each first part is the same as a line width of each second part.

In some implementations, in the array substrate provided by the embodiment of the present disclosure, a farthest end of each second part away from the first part is of a round angle.

In some implementations, in the array substrate provided by the embodiment of the present disclosure, the strip-shaped electrodes each extend along a third direction, and are arranged along a fourth direction intersecting the third direction;
  the first electrode further includes a connection electrode, the connection electrode includes a first connection electrode, a second connection electrode and a third connection electrode, the first connection electrode and the second connection electrode each extend in the first direction and are arranged in the second direction, and the third connection electrode is connected to the first connection electrode and the second connection electrode at the first side;
  each first part is connected to the first connection electrode or the third connection electrode, each strip-shaped electrode is connected between the second connection electrode and the third connection electrode and is not overlapped with the second side, and a length of an orthographic projection of each strip-shaped electrode in the first direction is less than a distance between the first side and the second side.

In some implementations, in the array substrate provided by the embodiment of the present disclosure, the strip-shaped electrodes include a plurality of first strip-shaped electrodes and a plurality of second strip-shaped electrodes, a direction in which each of the first strip-shaped electrodes extends is different from a direction in which each of the second strip-shaped electrodes extends.

In some implementations, in the array substrate provided by the embodiment of the present disclosure, the first strip-shaped electrodes and the second strip-shaped electrodes are symmetrical with respect to the first direction.

In some implementations, in the array substrate provided by the embodiment of the present disclosure, an included angle between the first strip-shaped electrodes and the second strip-shaped electrodes is greater than or equal to about 80° and less than or equal to about 100°, or an included angle between the first strip-shaped electrodes and the second strip-shaped electrodes is greater than about 0° and less than or equal to about 10°.

In some implementations, in the array substrate provided by the embodiment of the present disclosure, each of the second parts is bent toward a side away from a symmetry axis of the first strip-shaped electrodes and the second strip-shaped electrodes.

In some implementations, in the array substrate provided by the embodiment of the present disclosure, each of the second parts is bent toward a side close to the symmetry axis of the first strip-shaped electrodes and the second strip-shaped electrodes.

In some implementations, in the array substrate provided by the embodiment of the present disclosure, a distance between each strip-shaped electrode and the symmetry axis gradually decreases from an end of the strip-shaped electrode close to the first side to an end of the strip-shaped electrode close to the second side.

In some implementations, in the array substrate provided by the embodiment of the present disclosure, the first electrode further includes a connection electrode, and the connection electrode includes a first connection electrode, a second connection electrode and a third connection electrode, the first connection electrode and the second connection electrode each extend in the first direction and are arranged in the second direction, and the third connection electrode is connected to the first connection electrode and the second connection electrode at the first side.

In some implementations, in the array substrate provided by the embodiment of the present disclosure, for the first strip-shaped electrodes and the second strip-shaped electrodes having orthographic projections each with a length in the first direction less than the distance between the first side and the second side and not overlapping with the second side, ends of the first strip-shaped electrode and the second strip-shaped electrode symmetrical with respect to a perpendicular bisector of the third connection electrode are connected, and another ends of the first strip-shaped electrode and the second strip-shaped electrode are connected to the third connection electrode;

the first part of each first strip-shaped electrode is connected to the first connection electrode or the third connection electrode, and the first part of each second strip-shaped electrode is connected to the second connection electrode or the third connection electrode.

In some implementations, in the array substrate provided by the embodiment of the present disclosure, a distance between each strip-shaped electrode and the symmetry axis gradually increases from an end of the strip-shaped electrode close to the first side to an end of the strip-shaped electrode close to the second side.

In some implementations, in the array substrate provided by the embodiment of the present disclosure, the first electrode further includes a connection electrode, and the connection electrode includes a first connection electrode, a second connection electrode, a third connection electrode and a fourth connection electrode, the first connection electrode, the fourth connection electrode and the second connection electrode each extend in the first direction and are arranged in the second direction, and the third connection electrode is connected to the first connection electrode, the fourth connection electrode and the second connection electrode at the first side.

In some implementations, in the array substrate provided by the embodiment of the present disclosure, for the first strip-shaped electrodes and the second strip-shaped electrodes having orthographic projections each with a length in the first direction less than the distance between the first side and the second side and not overlapping with the second side, each first strip-shaped electrode is connected between the first connection electrode and the third connection electrode, and each second strip-shaped electrode is connected between the second connection electrode and the third connection electrode;

the first part of each first strip-shaped electrode is connected to the third connection electrode or the fourth connection electrode; the first part of each second strip-shaped electrode is connected to the third connection electrode or the fourth connection electrode.

In some implementations, the array substrate provided by the embodiment of the present disclosure further includes a second electrode between the first electrode and the base substrate or on a side of the first electrode away from the base substrate, and the second electrode is a planar electrode.

In some implementations, in the array substrate provided by the embodiment of the present disclosure, an orthographic projection of the first electrode on the base substrate is located within an orthographic projection of the second electrode on the base substrate.

In some implementations, in the array substrate provided by the embodiment of the present disclosure, a distance between a boundary of the orthographic projection of the second electrode on the base substrate and an orthographic projection of the data line adjacent to the second electrode on the base substrate is less than a distance between a boundary of the orthographic projection of the first electrode on the base substrate and an orthographic projection of the data line adjacent to the first electrode on the base substrate.

In some implementations, the array substrate provided by the embodiment of the present disclosure further includes a first alignment layer on a side, away from the base substrate, of a layer where the pixel units are located, and an alignment direction of the first alignment layer is from the first side to the second side.

In another aspect, an embodiment of the present disclosure provides a liquid crystal display panel, including:
the array substrate described above and a color filter substrate arranged opposite to each other; and
a liquid crystal layer between the array substrate and the color filter substrate.

In some implementations, in the liquid crystal display panel provided by the embodiment of the present disclosure, the color filter substrate includes a black matrix, or the array substrate includes a black matrix located on a side of a pixel electrode facing the liquid crystal layer;
at least part of an orthographic projection of each second part on a layer where the liquid crystal display panel is located is within an orthographic projection of the black matrix on the layer where the liquid crystal display panel is located.

In some implementations, in the liquid crystal display panel provided by the embodiment of the present disclosure, a line width $d_{BM}$ of the black matrix satisfies a following relation:

$$d_{BM} = d_{cell} + 2 \times d_{assignment}$$

where $d_{cell}$ is a thickness of a cell of the liquid crystal display panel formed between the array substrate and the color filter substrate, and $d_{alignment}$ indicates an alignment accuracy between the array substrate and the color filter substrate of the liquid crystal display panel.

In another aspect, an embodiment of the present disclosure further provides a liquid crystal display device including the liquid crystal display panel described above.

DETAIL DESCRIPTION OF EMBODIMENTS

Figure 1:
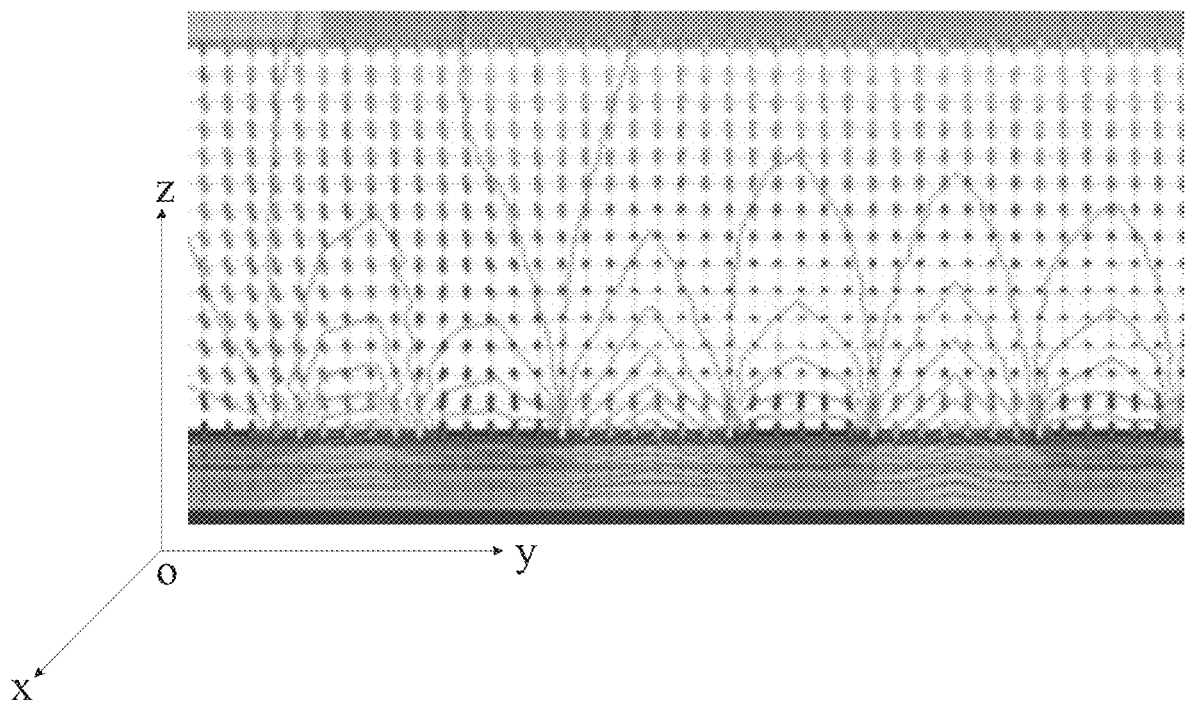
FIGS. 1 and 2 are schematic diagrams illustrating distributions of an electric field in the related art.

To make objects, technical solutions and advantages of embodiments of the present disclosure more apparent, the technical solutions of the embodiments of the present disclosure will be clearly and completely described below with reference to the drawings of the embodiments of the present disclosure. It should be noted that sizes and shapes of various figures in the drawings are not to scale, but are merely intended to schematically illustrate the present disclosure. Moreover, throughout the drawings, the like reference numerals refer to like or similar elements or elements having like or similar functions. It is to be understood that the described embodiments are only a few embodiments of the present disclosure, and not all embodiments. All other embodiments, which may be derived by a person skilled in the art from the described embodiments of the present disclosure without any inventive effort, are intended to be within the protection scope of the present disclosure.

Unless defined otherwise, technical or scientific terms used herein shall have the ordinary meaning as understood by one of ordinary skill in the art to which this disclosure belongs. The terms "first," "second," and the like, as used in the description and in the claims, do not denote any order, quantity, or importance, but rather are used to distinguish one element from another. The word "comprising/including" or "comprise/include", and the like, means that the element or item preceding the word contains the element or item listed after the word and its equivalent, but does not exclude other elements or items. Terms "inner", "outer", "upper", "lower", and the like are used merely to indicate relative positional relationships, and when an absolute position of the object being described is changed, the relative positional relationships may be changed accordingly.

With the development of display technology, advanced display products have put higher expectations on various performances of displays. A display in a vertical alignment (VA) mode has a relatively high front-view contrast, but the contrast is not uniform at different viewing angles. A display in an Advanced Super Dimension Switch (ADS) mode has more excellent characteristics in wide viewing angle (i.e., brightness of backlight transmitted does not change with a change of viewing angle). In order to combine advantages of displays in such two modes, a liquid crystal mode using a fringe field to drive a vertical alignment is proposed. Structures of electrodes in the liquid crystal mode are the same as those in the ADS mode, that is, a pixel electrode and a common electrode are located in two layers, including upper and lower layers, of a same substrate, where the electrode in one layer is designed as strip-shaped electrodes and the electrode in the other layer is designed as a planar electrode. Liquid crystal molecules and initial alignments thereof in the liquid crystal mode are the same as those in the VA mode, that is, vertically aligned negative liquid crystal molecules or positive liquid crystal molecules are used. During the liquid crystal molecules are not driven (i.e., in a dark state L0), the liquid crystal mode has an L0 level the same as that of the VA mode, and when the liquid crystal molecules are driven, the liquid crystal mode has the wide viewing angle and a color advantage of the ADS mode, and has a simpler pixel structure than the VA mode.

Figure 2:
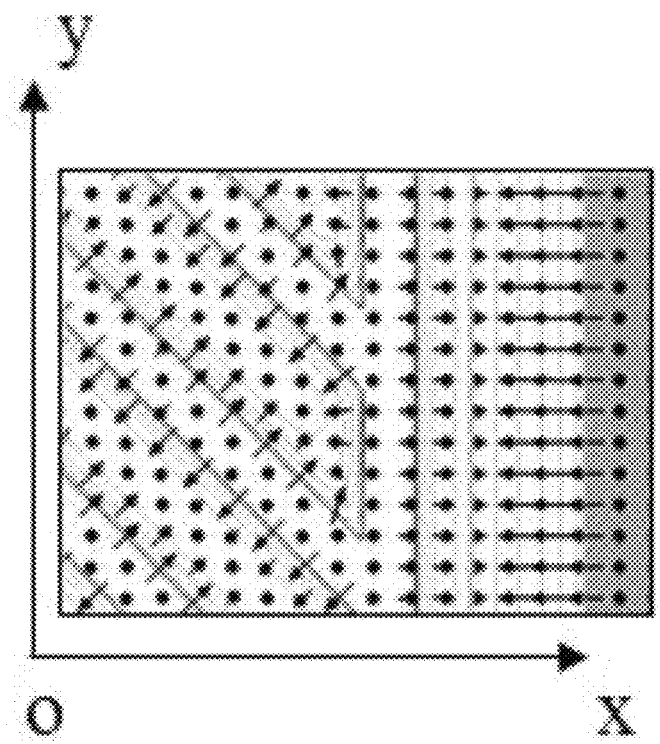

When a non-zero electric field is applied, the liquid crystal molecules are driven, in such case, an effective electric field between the strip-shaped electrodes includes a vertical component Ez and a component Ey in a direction perpendicular to a direction in which each of the strip-shaped electrodes extends, as shown in FIG. 1. The vertical component Ez deflects the liquid crystal molecules from a vertical direction to a horizontal direction (in xy-plane), and the component Ey in the direction perpendicular to the direction in which each of the strip-shaped electrodes extends rotates the liquid crystal molecules to a direction parallel to the strip-shaped electrodes in the xy-plane, so as to complete rotation of the liquid crystal molecules. However, in order to connect the strip-shaped electrodes, a connection electrode is generally disposed around the strip-shaped electrodes, and in such case, at an edge area of the strip-shaped electrodes, an electric field between the connection electrode and the planar electrode is added in addition to the effective electric field between the strip-shaped electrodes and the planar electrode, and the added electric field has a component Ex in an x direction, as shown in FIG. 2. It is clear that since directions of the electrodes are different, a distribution of the electric field at the edge area is relatively complicated, so that the liquid crystal molecules are difficult to be deflected, and black disclination lines may appear.

In view of above technical problems in the related art, an embodiment of the present disclosure provides an array substrate, and as shown in FIGS. 3 to 6, the array substrate includes: a base substrate 01; a plurality of gate lines 02 each extending in a first direction on the base substrate 01; a plurality of data lines 03 each extending in a second direction intersecting the first direction; a plurality of pixel units located in regions defined by the gate lines 02 and the data lines 03; each of the pixel units has a first side and a second side each extending in the second direction and opposite to each other in the first direction; each of the pixel units includes a first electrode 04, the first electrode 04 includes a plurality of strip-shaped electrodes 401, at least part of the strip-shaped electrodes 401 each have a first part P1 and a second part P2 extending in different directions, first parts P1 are connected to each other at the first side, second parts P2 are disconnected from each other at the second side, and lengths of the first part P1 and the second part P2 are different.

Figure 7:
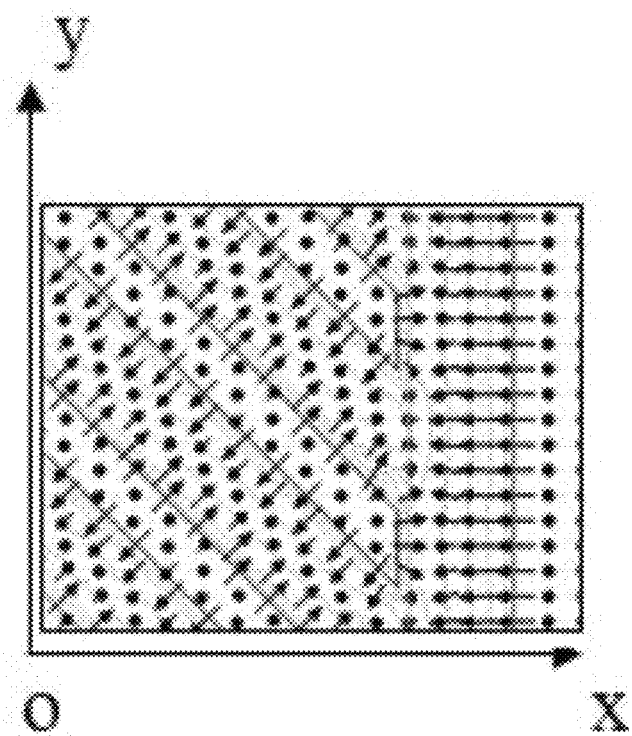
FIG. 7 is a schematic diagram of a distribution of an electric field according to an embodiment of the present disclosure.

In the array substrate provided by the embodiment of the present disclosure, the second parts P2 of at least part of the strip-shaped electrodes 401 are disconnected from each other at the second side, so that the component Ex of the electric field between the second parts P2 (corresponding to edge parts of the strip-shaped electrodes 401) adjacent to the second side and the planar electrode is reduced, and the distribution of the electric field is optimized, as shown in FIG. 7. Therefore, the electric field between the strip-shaped electrodes 401 as a whole and the planar electrode can be regarded as only including two effective components Ez and Ey, and in such case, the first electrode 04 can control corresponding liquid crystal molecules locate in a middle area and an edge area of the first electrode to be rotated to a similar degree, thereby effectively avoiding an occurrence of black disclination lines and improving the display effect.

Figure 8:
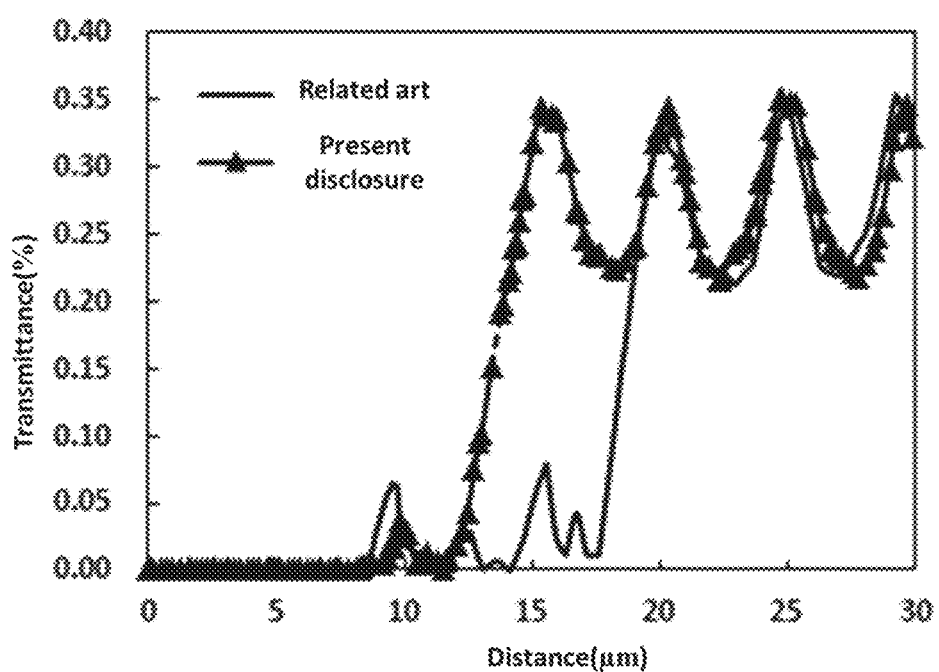
FIG. 8 is a graph showing transmittance corresponding to a second part of a slit electrode according to an embodiment of the present disclosure.
Figure 9:
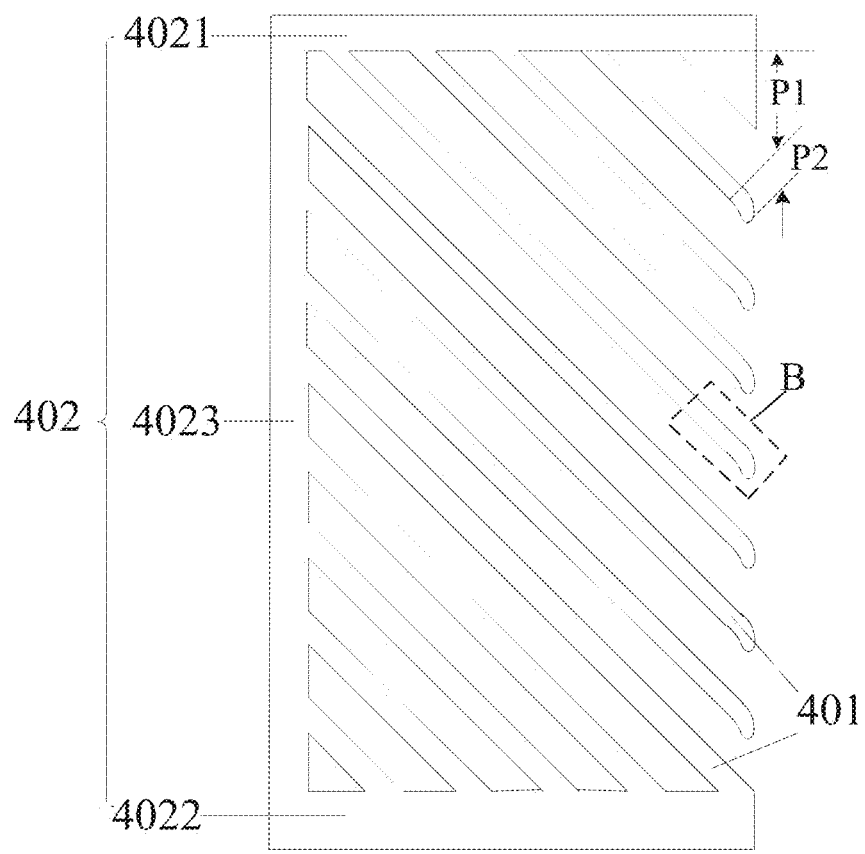
FIG. 9 is a schematic diagram of a structure of a slit electrode according to an embodiment of the present disclosure.

A test result indicates that, compared to the related art in which the strip-shaped electrodes 401 are not disconnected, on one hand, by providing the second parts P2 being disconnected from each other at the second side, the present disclosure can move a black area where the disclination lines are located to outside of an effective display area (AA) by about 4.9 μm, as shown in FIG. 8, thereby effectively improving the display quality. On the other hand, a gray scale response time obtained in the related art is about 29.9 ms, and the gray scale response time obtained in the present disclosure is about 23.2 ms, it can be seen that, an increased response speed is resulted in by providing the second parts P2 being disconnected from each other at the second side, this is because by providing the second parts P2 being disconnected from each other at the second side, a process of occurrence, movement and stabilization of the disclination lines is avoided.

In some implementations, in the array substrate provided by the embodiment of the present disclosure, to ensure light transmittance, a line width of each of the strip-shaped electrodes 401 may be greater than or equal to about 1.9 μm and less than or equal to about 3.3 μm, a distance between the strip-shaped electrodes 401 may be greater than or equal to about 2.3 μm and less than or equal to about 4.8 μm, and an included angle between a direction in which each of the strip-shaped electrodes 401 extends and an optical axis (i.e., a light transmission axis) of a polarizer may be greater than or equal to about 35° and less than or equal to about 55°, for example, may be equal to 45°. It should be noted that, in response to that each strip-shaped electrode 401 includes the first part P1 and the second part P2 extending in different directions, the direction in which each strip-shaped electrode 401 extends refers to a direction in which the part of the strip-shaped electrode 401 having a larger length extends. For example, if the length of the first part P1 is greater than that of the second part P2, the direction in which the strip-shaped electrode 401 extends is the direction in which the first part P1 extends, and the direction in which the strip-shaped electrode 401 extends being the direction in which the first part P1 extends is taken as an example for illustration below.

In some implementations, in the array substrate provided by the embodiment of the present disclosure, in order to effectively increase the component Ey of the electric field and reduce the component Ex of the electric field, an included angle between the direction in which the first part P1 extends and the direction in which the second part P2 extends may be set to be greater than about 0° and less than or equal to about 45°. In some implementations, the included angle between the direction in which the first part P1 extends and the direction in which the second part P2 extends is greater than or equal to about 10° and less than or equal to about 15°. For example, the included angle between the direction in which the first part P1 extends and the direction in which the second part P2 extends may be about 10°, 11°, 12°, 13°, 14°. 15°, or the like.

Figure 6:
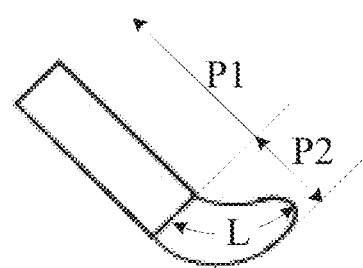
FIG. 6 is an enlarged structural view of an area A in FIG. 5.

In some implementations, in the array substrate provided by the embodiment of the present disclosure, the length of the second part P2 is less than that of the first part P1, the length of the second part P2 may be designed and adjusted according to an edge area of each pixel unit. Illustratively, as shown in FIG. 6, the length L of the second part P2 in the direction in which the second part P2 extends may be designed to be greater than or equal to about 1 μm and less than or equal to about 3 μm, for example, may be about 1 μm, 1.5 μm, 2 μm, 2.5 μm, 3 μm, or the like. In some implementations, in response to that the second part P2 is in a shape of a straight line, the direction in which the second part P2 extends is a direction along the straight line; in response to that the second part P2 is in a shape of a polygonal line, the direction in which the second part P2 extends is a direction along the polygonal line; and in response to that the second part P2 is in a shape of a curved line, the direction in which the second part P2 extends is a direction along the curved line.

Figure 5:
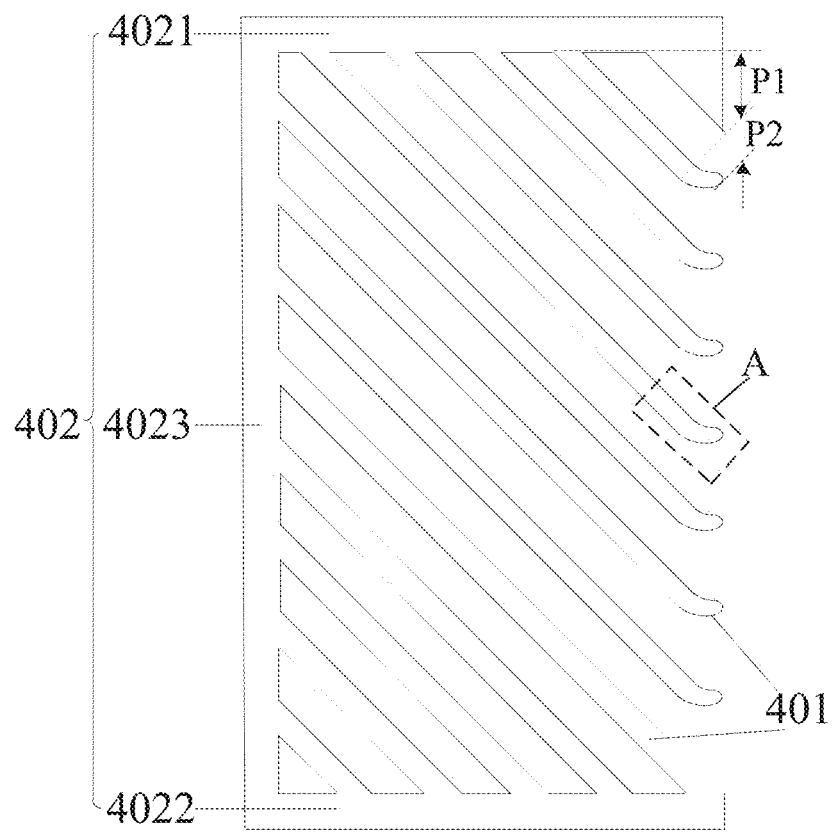
FIG. 5 is a schematic diagram of a structure of a slit electrode according to an embodiment of the present disclosure.

In some implementations, in the array substrate provided by the embodiment of the present disclosure, the first part P1 and the second part P2 each may be in a shape of a straight line, a polygonal line, or a curved line, for example, as shown in FIGS. 5 and 6, the first part P1 is in a shape of a straight line, and the second part P2 is in a shape of a curved line that is curved away from the direction in which the first part P1 extends. As can be seen from FIGS. 5 and 6, the first part P1 is a part extending in the same direction as the direction in which the strip-shaped electrode 401 as a whole extends, and the second part P2 is a part extending in a direction different from the direction in which the strip-shaped electrode 401 as a whole extends.

In the related art, a transition region is generated between a liquid crystal motionless region (where the liquid crystal molecules are motionless) of the edge area and a liquid crystal rotation region (where the liquid crystal molecules are rotated) of the middle area, and under different voltages applied, a balance between rotation and non-rotation of the liquid crystal molecules is different, thereby causing a position of black disclination lines to be unfixed. By providing the second section P2 to be curved or 11 bent away from the direction in which the first section P1 extends, the component Ey of the electric field is further increased, and the component Ex of the electric field being harmful is reduced, so that the disclination lines can be fixed or even eliminated.

In some implementations, in the array substrate provided by the embodiment of the present disclosure, as shown in FIG. 5, part or all of the second parts P2 have a same radian, so as to facilitate a process of manufacturing.

In some implementations, in the array substrate provided by the embodiment of the present disclosure, to facilitate the process of manufacturing, a line width of the first part P1 may be set to be the same as a line width of the second part P2, for example, the line width of each of the first part P1 and the second part P2 is greater than or equal to about 1.9 µm and less than or equal to about 3.3 µm. It should be noted that, in the process of manufacturing, due to influences of etching and other factors, the line width of the second part P2 is slightly reduced as the distance between the second part P1 and the first part P2 increases. In addition, an end of the second part P2 away from the first part P1 may be of a right angle, an acute angle, an obtuse angle, or a round angle, and generally, due to influences of etching and other factors, and a farthest end of the second part P2 away from the first part P1 is of a round angle, as shown in FIG. 6.

In some implementations, in the array substrate provided by the embodiment of the present disclosure, the first electrode 04 may be of a single domain structure, a double domain structure, a four domain structure, or the like.

For example, as shown in FIGS. 5, 6, 9, and 10, the first electrode 04 is of a single domain structure, and in particular, the first electrode 04 includes a plurality of strip-shaped electrodes 401, which each extend along a third direction and are arranged along a fourth direction intersecting the third direction; an included angle between the third direction and the optical axis of the polarizer is greater than or equal to about 350 and less than or equal to about 55°, for example, may be about 45°.

The first electrode 04 further includes a connection electrode 402, the connection electrode 402 includes a first connection electrode 4021, a second connection electrode 4022 and a third connection electrode 4023, the first connection electrode 4021 and the second connection electrode 4022 each extend in the first direction and are arranged in the second direction, the third connection electrode 4023 is connected to the first connection electrode 4021 and the second connection electrode 4022 at the first side.

The first part P1 is connected to the first connection electrode 4021 or the third connection electrode 4023, each strip-shaped electrode 401 is connected between the second connection electrode 4022 and the third connection electrode 4023 and is not overlapped with the second side, and a length of an orthographic projection of each strip-shaped electrode 401 in the first direction is less than a distance between the first side and the second side.

For another example, as shown in FIGS. 11 to 18, the first electrode 04 is of a double-domain structure, and the strip-shaped electrodes 401 include a plurality of first strip-shaped electrodes 4011 and a plurality of second strip-shaped electrodes 4012; a direction in which the first strip-shaped electrodes 4011 each extend is different from a direction in which the second strip-shaped electrodes 4012 extend. In some implementations, the first strip-shaped electrodes 4011 and the second strip-shaped electrodes 4012 are symmetrical with respect to the first direction. In FIGS. 11 to 16, an included angle between the first strip-shaped electrodes and the second strip-shaped electrodes is greater than or equal to about 80° and less than or equal to about 100°, for example, may be about 90°; in FIGS. 17 and 18, the included angle between the first strip-shaped electrodes 4011 and the second strip-shaped electrodes 4012 is greater than about 0° and less than or equal to about 10°. In particular, the included angle between the first strip-shaped electrodes 4011 and the second strip-shaped electrodes 4012 may be determined according to directions of optical axes (i.e., light transmission axes) of upper and lower polarizers.

Figure 10:
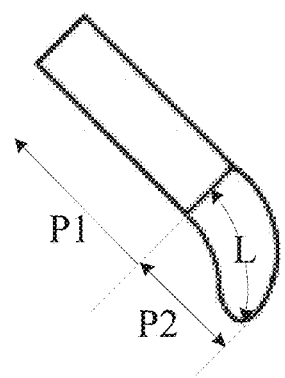
FIG. 10 is an enlarged structural view of an area B in FIG. 9.
Figure 16:
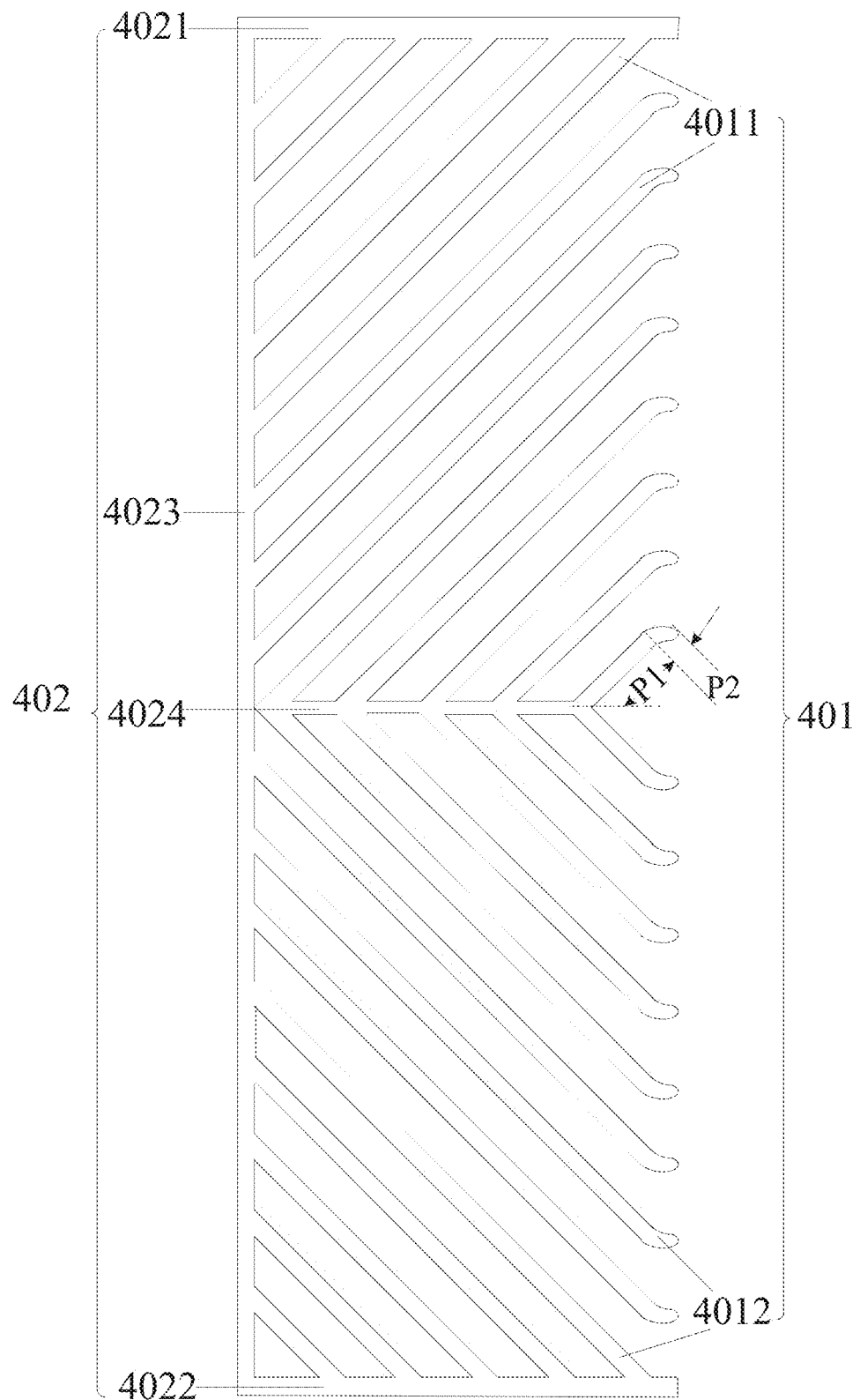
FIG. 16 is a schematic diagram of a structure of a slit electrode according to an embodiment of the present disclosure.
Figure 17:
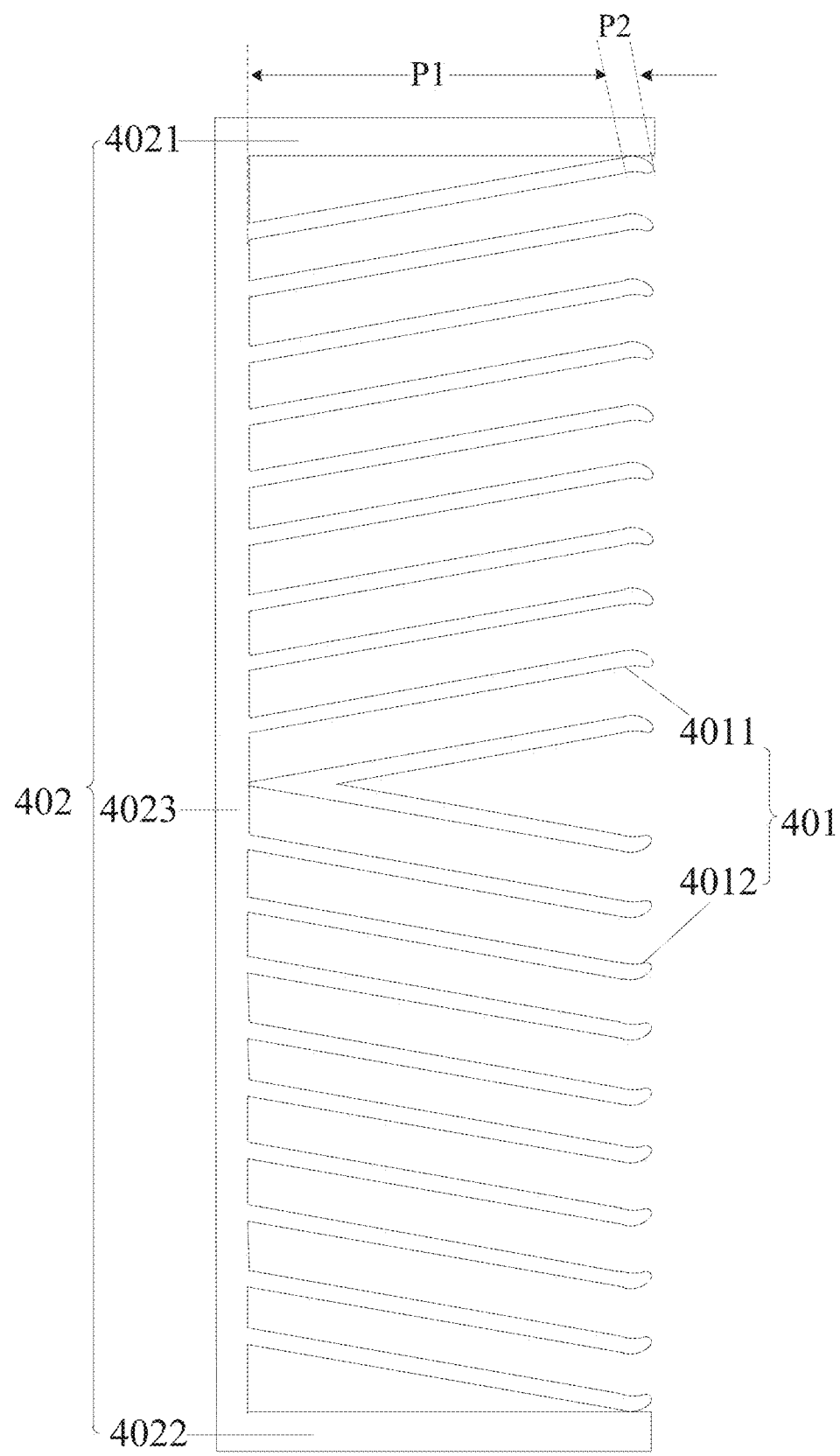
FIG. 17 is a schematic diagram of a structure of a slit electrode according to an embodiment of the present disclosure.
Figure 18:
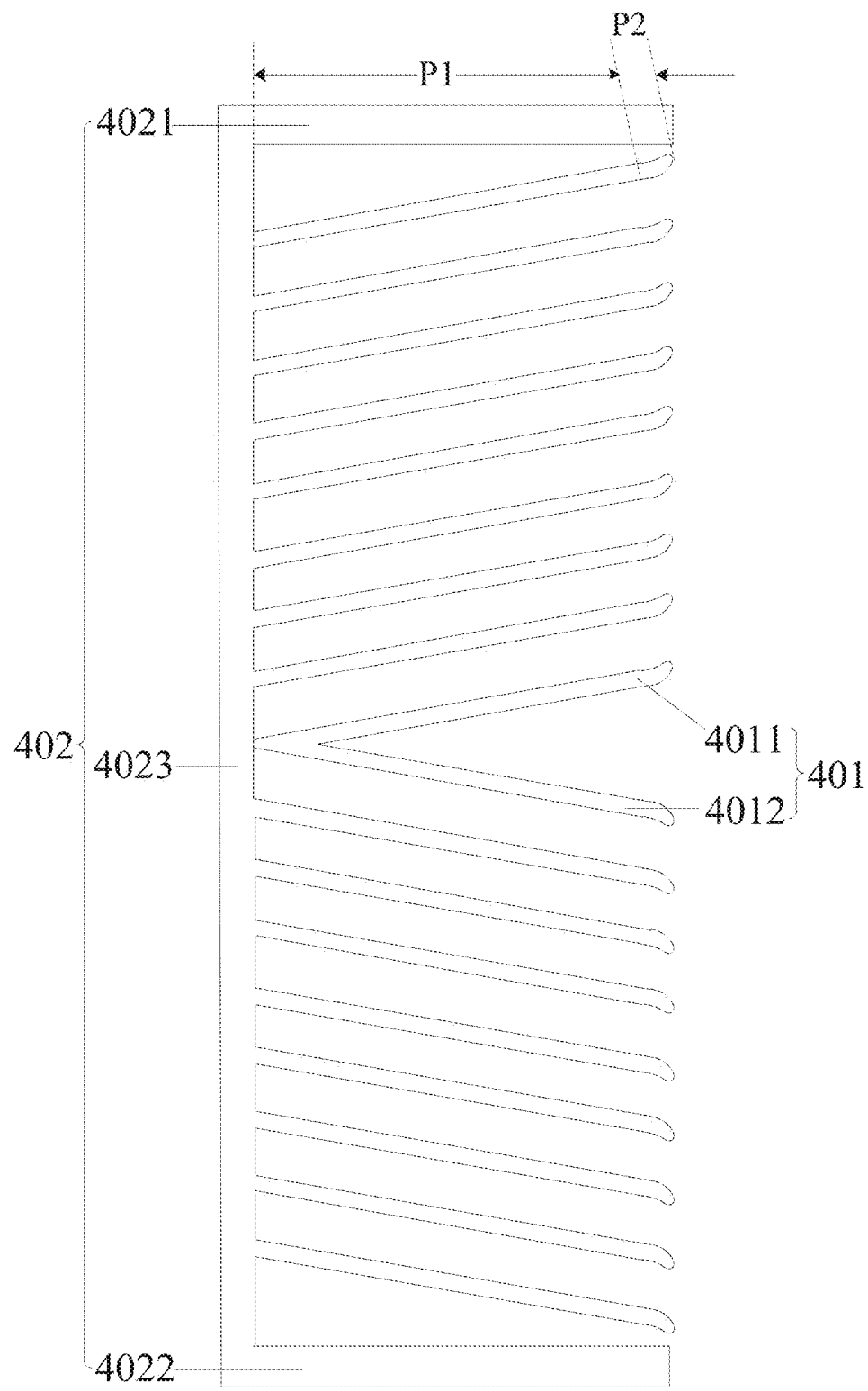
FIG. 18 is a schematic diagram of a structure of a slit electrode according to an embodiment of the present disclosure.

It should be noted that, since the first strip-shaped electrode 4011 having the second part P2 and the second strip-shaped electrode 4012 having the second part P2 are symmetrically arranged, in some implementations, a shape of the second part P2 of the first strip-shaped electrode 4011 and a shape of the second part P2 of the second strip-shaped electrode 4012 are also symmetrical. In particular, FIG. 6 shows the shape of the second part P2 of the first strip-shaped electrode 4011, which is symmetrical with the shape of the second part P2 of the second strip-shaped electrode 4012 shown in FIG. 12; FIG. 10 shows the shape of the second part P2 of the first strip-shaped electrode 4011, which is symmetrical with the shape of the second part P2 of the second strip-shaped electrode 4012 shown in FIG. 14. In addition, FIGS. 15 and 17 show an arrangement of the second parts P2 of the first strip-shaped electrode 4011 and the second strip-shaped electrode 4012 that are symmetrical with each other, which is substantially the same as that in FIG. 11, and FIGS. 16 and 18 show an arrangement of the second parts P2 of the first strip-shaped electrode 4011 and the second strip-shaped electrode 4012 that are symmetrical with each other, which is substantially the same as that in FIG. 13.

Figure 11:
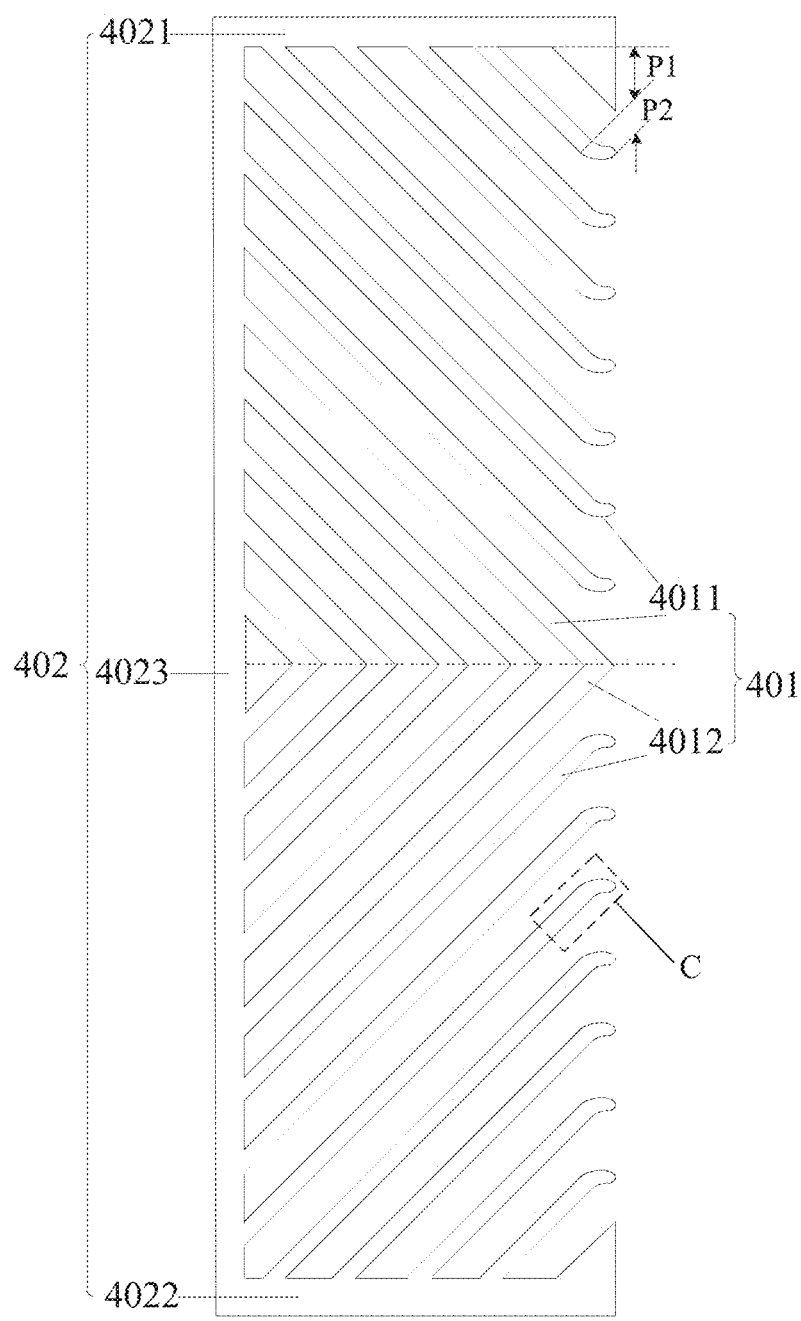
FIG. 11 is a schematic diagram of a structure of a slit electrode according to an embodiment of the present disclosure.
Figure 12:
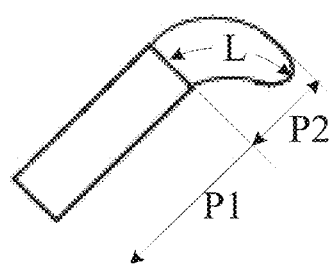
FIG. 12 is an enlarged structural view of an area C in FIG. 11.
Figure 13:
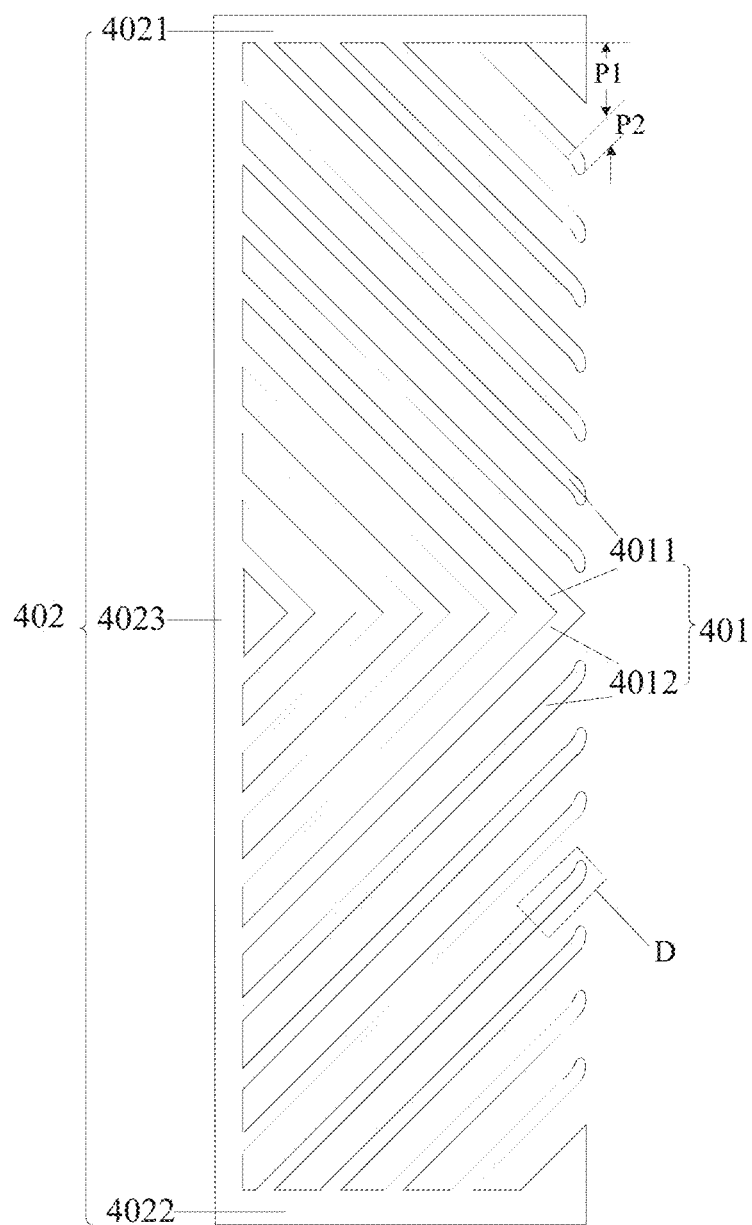
FIG. 13 is a schematic diagram of a structure of a slit electrode according to an embodiment of the present disclosure.
Figure 14:
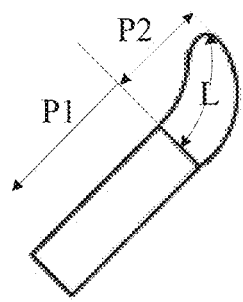
FIG. 14 is an enlarged structural view of an area D in FIG. 13.
Figure 15:
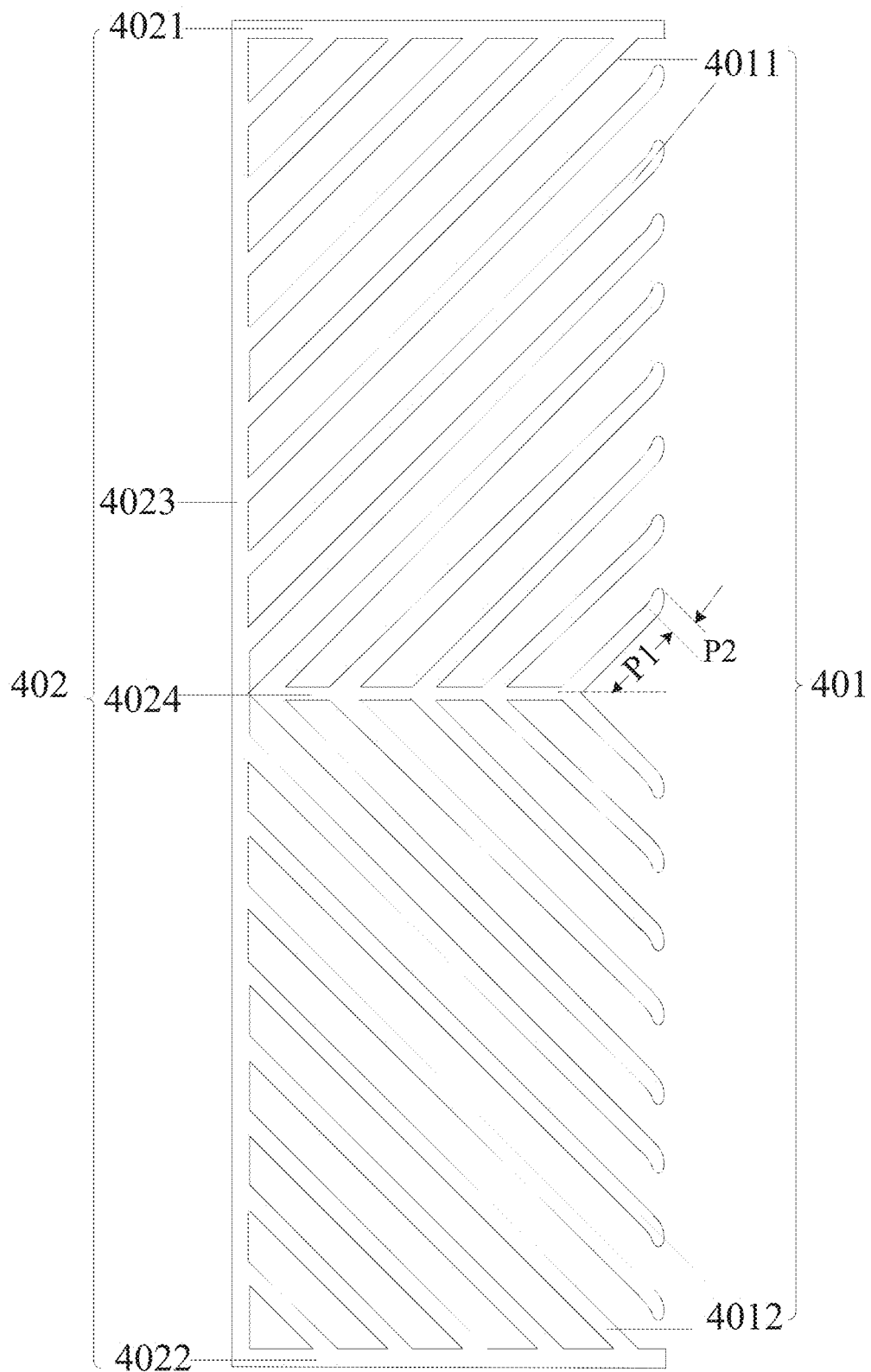
FIG. 15 is a schematic diagram of a structure of a slit electrode according to an embodiment of the present disclosure.

In FIGS. 11 and 15, each second part P2 is bent or curved toward a side away from a symmetry axis of the first strip-shaped electrodes 4011 and the second strip-shaped electrodes 4012. In FIGS. 13 and 16, each second part P2 is bent or curved toward a side close to the symmetry axis of the first strip-shaped electrodes 4011 and the second strip-shaped electrodes 4012. The second parts P2 being bent toward the side away from the symmetry axis of the first strip-shaped electrodes 4011 and the second strip-shaped electrodes 4012 is more effective than the second parts P2 being bent toward the side close to the symmetry axis of the first strip-shaped electrodes 4011 and the second strip-shaped electrodes 4012. That is, each second part P2 being bent toward the side close to the symmetry axis of the first strip-shaped electrodes 4011 and the second strip-shaped electrodes 4012 causes a distance between any two adjacent strip-shaped electrodes 401 (i.e., a distance between each second part P2 and the first part P1 adjacent to the second part P2) to be shortened; compared with each second part P2 being bent toward the side close to the symmetry axis of the first strip-shaped electrodes 4011 and the second strip-shaped electrodes 4012, each second part P2 being bent toward the side away from the symmetry axis of the first strip-shaped electrodes 4011 and the second strip-shaped electrodes 4012 does not cause the distance between any adjacent strip-shaped electrodes 401 to be increased, the component Ey of the effective electric field can be increased more, so that an influence of unnecessary harmful electric fields can be avoided, and the liquid crystal molecules corresponding to the edge area and the middle area can be kept to be deflected to a consistent direction. Test results show that the gray scale response time, obtained by making each second part P2 bend toward the side close to the symmetry axis of the first strip-shaped electrodes 4011 and the second strip-shaped electrodes 4012, is about 19 ms, and the gray scale response time, obtained by making each second part P2 bend toward the side away from the symmetry axis of the first strip-shaped electrodes 4011 and the second strip-shaped electrodes 4012, is about 17 ms.

In addition, as shown in FIG. 11 and FIG. 13, a distance between each strip-shaped electrode 401 and the symmetry axis gradually decreases from an end of the strip-shaped electrode 401 close to the first side to an end of the strip-shaped electrode 401 close to the second side, so that a structure similar to ">" is formed between the first strip-shaped electrode 4011 and the second strip-shaped electrode 4012. In such case, in order to connect the strip-shaped electrodes 401, as shown in FIGS. 11 and 13, the first electrode 04 further includes a connection electrode 402, and the connection electrode 402 includes a first connection electrode 4021, a second connection electrode 4022 and a third connection electrode 4023, the first connection electrode 4021 and the second connection electrode 4022 each extend in the first direction and are arranged in the second direction, and the third connection electrode 4023 is connected to the first connection electrode 4021 and the second connection electrode 4022 at the first side.

For the first strip-shaped electrodes 4011 and the second strip-shaped electrodes 4012, which have orthographic projections each with a length in the first direction less than the distance between the first side and the second side and are not overlapped with the second side, ends of the first strip-shaped electrode 4011 and the second strip-shaped electrode 4012, which are symmetrical with respect to a perpendicular bisector of the third connection electrode 402, are connected, and another ends of the first strip-shaped electrode 4011 and the second strip-shaped electrode 4012 are connected to the third connection electrode 4022; the first part P1 of each first strip-shaped electrode 4011 is connected to the first connection electrode 4021 or the third connection electrode 4023, and the first part P1 of each second strip-shaped electrode 4012 is connected to the second connection electrode 4022 or the third connection electrode 4023.

In FIGS. 15 and 16, a distance between each strip-shaped electrode 401 and the symmetry axis gradually increases from an end of the strip-shaped electrode 401 close to the first side to an end of the strip-shaped electrode 401 close to the second side, so that a structure similar to "<" is formed between the first strip-shaped electrode 4011 and the second strip-shaped electrode 4012. In such case, in order to connect the strip-shaped electrodes 401, as shown in FIGS. 15 and 16, the first electrode 04 further includes a connection electrode 402, the connection electrode 402 includes a first connection electrode 4021, a second connection electrode 4022, a third connection electrode 4023 and a fourth connection electrode 4024, the first connection electrode 4021, the fourth connection electrode 4024 and the second connection electrode 4022 each extend in the first direction and are arranged in the second direction, and the third connection electrode 4023 is connected to the first connection electrode 4021, the fourth connection electrode 4024, and the second connection electrode 4022 at the first side.

For the first strip-shaped electrodes 4011 and the second strip-shaped electrodes 4012, which have orthographic projections each with a length in the first direction less than the distance between the first side and the second side and are not overlapped with the second side, each first strip-shaped electrode 4011 is connected between the first connection electrode 4021 and the third connection electrode 4023, and each second strip-shaped electrode 4012 is connected between the second connection electrode 4022 and the third connection electrode 4023; the first part P1 of each first strip-shaped electrode 4011 is connected to the third connection electrode 4023 or the fourth connection electrode 4024; the first part P1 of the second strip-shaped electrode 4012 is connected to the third connection electrode 4023 or the fourth connection electrode 4024.

In FIGS. 17 and 18, since the strip-shaped electrodes 401 are inclined at a relatively small angle, first ends of all the strip-shaped electrodes 401 are connected to the third connection electrode 4023 at the first side.

Figure 3:
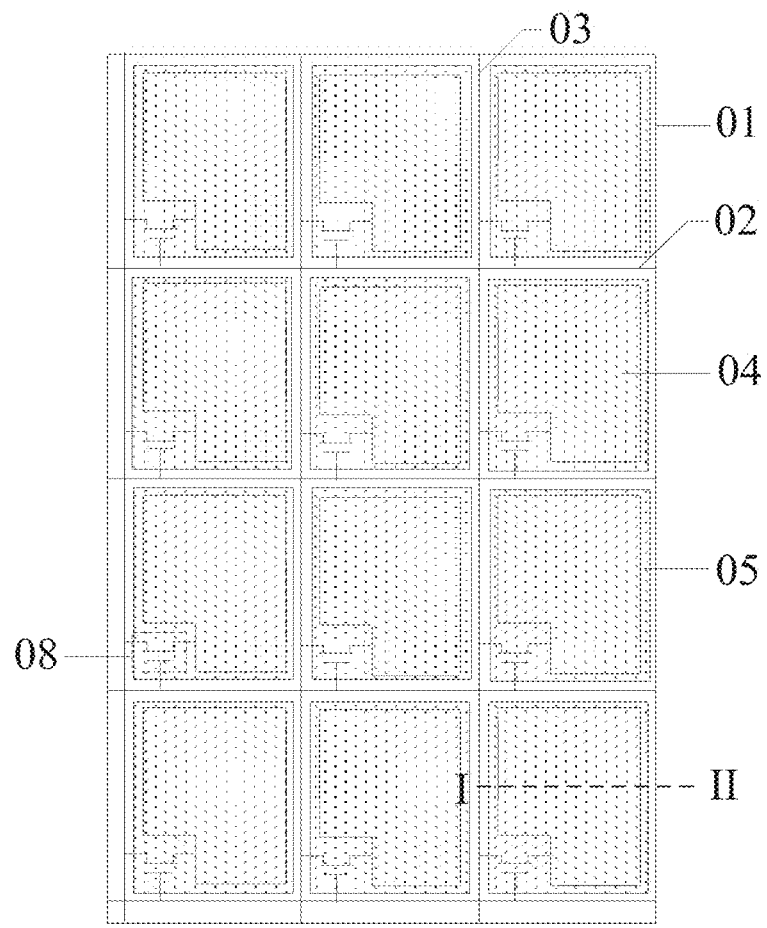
FIG. 3 is a schematic top view of an array substrate according to an embodiment of the present disclosure.
Figure 4:
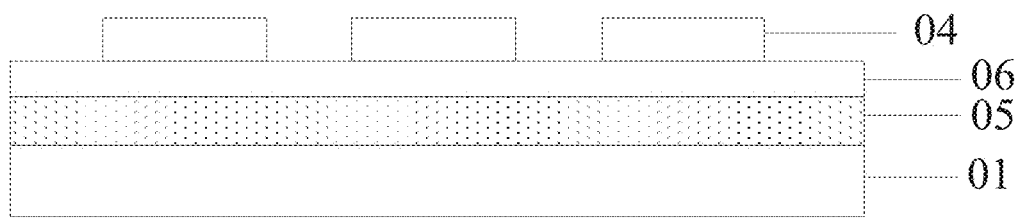
FIG. 4 is a schematic cross-sectional view taken along line I-II of FIG. 3.

In some implementations, as shown in FIG. 3 and FIG. 4, the array substrate provided by the embodiment of the present disclosure generally further includes a second electrode 05 between the first electrode 04 and the base substrate 01 and an insulating layer 06 between the first electrode 04 and the second electrode 05, and the second electrode 05 is a planar electrode. In some implementations, the second electrode s05 may also be located on a side of the first electrode 04 facing away from the base substrate 01. That is, the first electrode 04 may be a pixel electrode (Pix), and the second electrode 05 may be a common electrode (Com); or the first electrode 04 may be a common electrode and the second electrode 05 may be a pixel electrode, which is not limited herein. In the present disclosure, a case where the first electrode 04 is a pixel electrode and the second electrode 05 is a common electrode is taken as an example for explanation.

Figure 19:
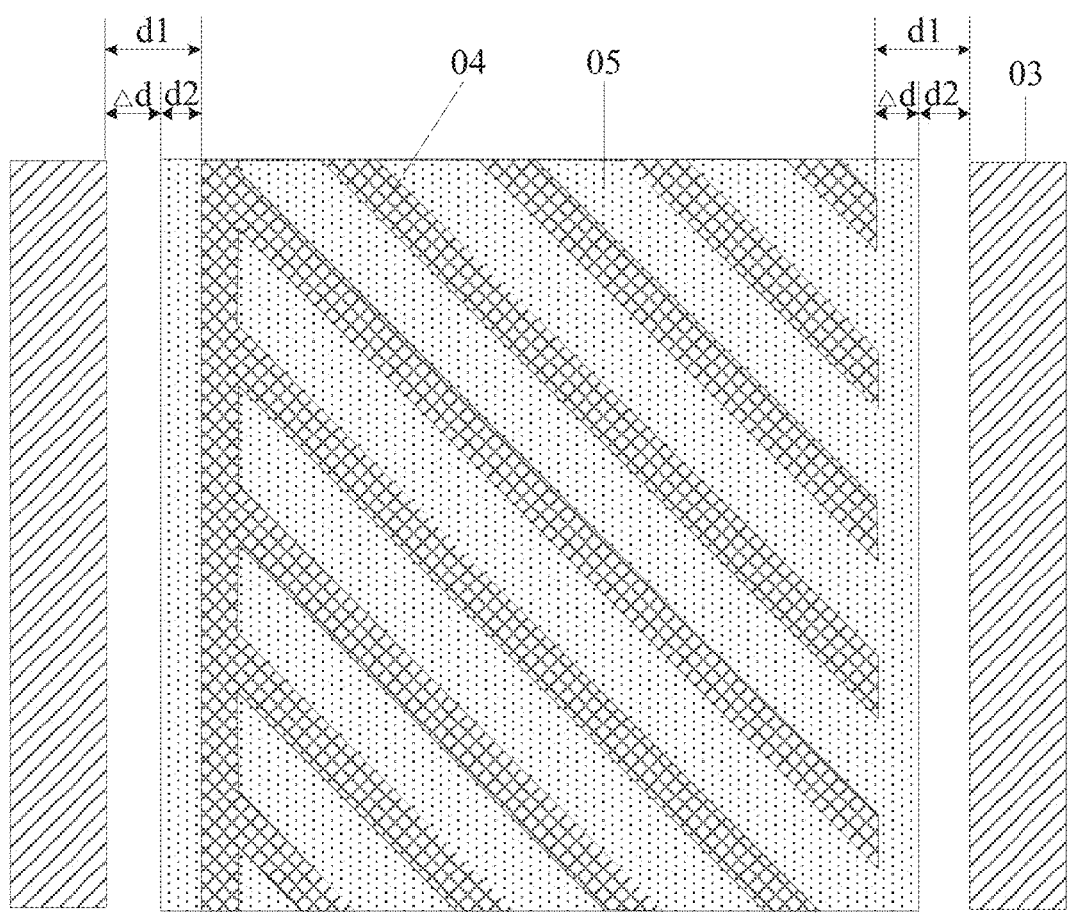
FIG. 19 is a schematic diagram illustrating relative sizes of a planar electrode and a slit electrode according to an embodiment of the disclosure.
Figure 20:
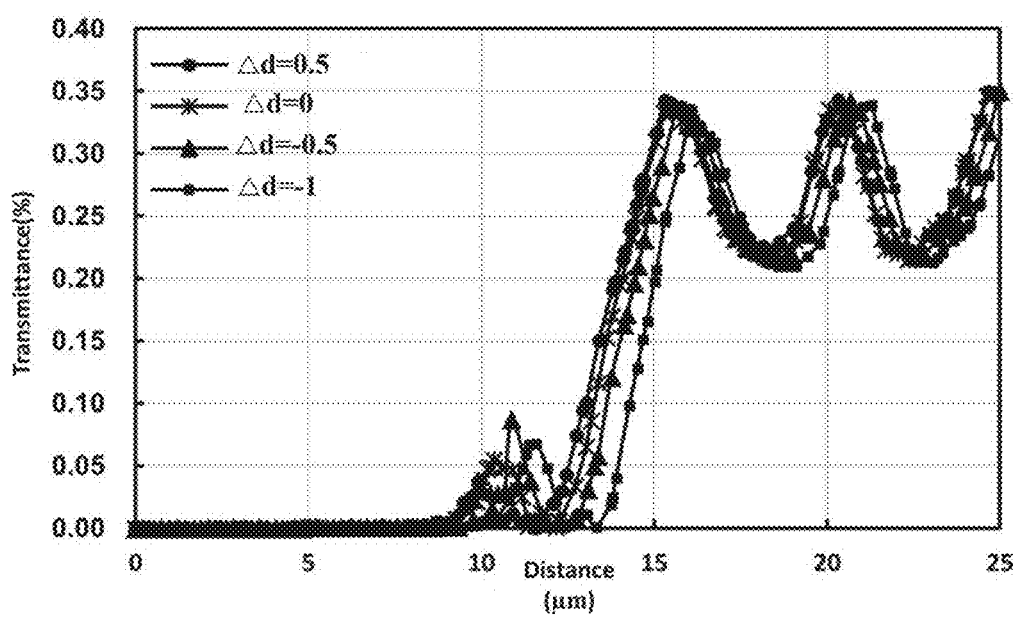
FIG. 20 is a graph showing transmittance corresponding to the second part under different relationships of sizes between a planar electrode and a slit electrode according to an embodiment of the present disclosure.

In some implementations, in the array substrate provided by the embodiment of the present disclosure, as shown in FIG. 3, the first electrode 04 is a pixel electrode, and the second electrode 05 is a common electrode, and since an electric field has a great influence on an arrangement of liquid crystal molecules, a size of the common electrode (for example, the second electrode 05) is optimized here. Assuming that distances from a boundary of the pixel electrode (e.g., the first electrode 04) to data lines 03 on left and right thereof are equal to a same distance d1, and distances from a boundary of the common electrode (e.g., the second electrode 05) to data lines 03 on left and right thereof are equal to a same distance d2, as shown in FIG. 19, on a basis of distances from the common electrode (e.g., the second electrode 05) and the pixel electrode (e.g., the first electrode 04) to the data lines 03 being equal (i.e., a difference Δd between the distance from the boundary of the common electrode to the data line 03 and the distance from the boundary of the pixel electrode to the data line 03 is substantially equal to 0), in response to that the common electrode (e.g., the second electrode 05) is enlarged by about 0.5 μm (i.e., Δd=0.5 μm), reduced by about 0.5 μm (i.e., Δd=−0.5 μm) and reduced by about 1.0 μm (i.e., Δd=−1 μm) in a direction toward the data line 03, respectively, the black area where the disclination lines are located is respectively away from the effective display area by about 0.22 μm, back into the effective display area by about 0.4 μm, and back into the effective display area by about 1.0 μm, as shown in FIG. 20. Therefore, in order to prevent the black area from entering the effective display area to affect the display effect, in the array substrate provided by the embodiment of the present disclosure, as shown in FIG. 1, an orthographic projection of the pixel electrode (e.g., the first electrode 04) on the base substrate 01 may be located within an orthographic projection of the common electrode (e.g., the second electrode 05) on the base substrate 01. That is, a distance between a boundary of the orthographic projection of the common electrode (for example, the second electrode 05) on the base substrate 01 and an orthographic projection of the data line 03 adjacent to the common electrode on the base substrate 01 is less than a distance between a boundary of the orthographic projection of the pixel electrode (for example, the first electrode 04) on the base substrate 01 and an orthographic projection of the data line 03 adjacent to the pixel electrode on the base substrate 01. In some implementations, the difference Δd between the distance from the boundary of the common electrode to the data line 03 and the distance from the pixel electrode to the data line 03 may be greater than or equal to about 0.5 μm and less than or equal to about 2.5 μm, for example, may be equal to about 0.5 μm, 1 μm, 1.5 μm, 2 μm, 2.5 μm, or the like.

Figure 21:
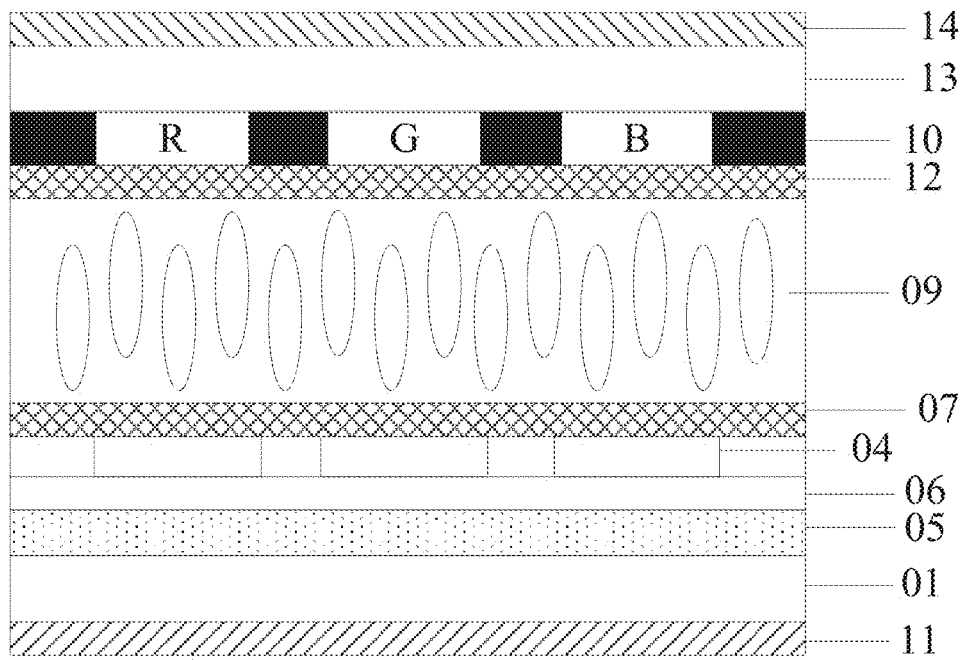
FIG. 21 is a schematic structural diagram of a liquid crystal display panel according to an embodiment of the present disclosure.

In some implementations, as shown in FIG. 21, the array substrate provided by the embodiment of the present disclosure further includes a first alignment layer 07 located on a side of a layer, where the pixel units are located, away from the base substrate 01, and an alignment direction of the first alignment layer 07 is directed from the first side to the second side, that is, the alignment (rubbing) direction of the first alignment layer 07 is approximately 0° (from left to right) in the present disclosure, and is directed from a side at which the strip-shaped electrodes 401 are not disconnected to a side at which the strip-shaped electrodes 401 are disconnected, so that a pretilt angle of the liquid crystal molecules is about 90°+5°, alternatively, the pretilt angle of the liquid crystal molecules is about 90°, and an azimuth angle of the liquid crystal molecules is about 0° 45°, and alternatively, the azimuth angle of the liquid crystal molecules is about 0°. In addition, since the occurrence of black disclination lines is more serious at an end position in the alignment (rubbing) direction (i.e., the second side), the black disclination lines can be effectively improved by removing the part of the connection electrode 402 at such side in the related art.

Generally, as shown in FIG. 3, the array substrate provided by the embodiment of the present disclosure may further include a transistor 08 connected to the pixel electrode (e.g., the first electrode 04); that is, the transistor 08 is disposed in a gap between the pixel units, and exemplarily, the transistor 08 is disposed in the gap between the pixel units at the first side.

Based on a same conception, an embodiment of the present disclosure further provides a liquid crystal display panel, and since a principle of solving problems of the liquid crystal display panel is similar to a principle of solving problems of the array substrate described above, implementations of the liquid crystal display panel provided by the embodiment of the present disclosure may refer to above implementations of the array substrate provided by the embodiment of the present disclosure, and repeated parts are not described here again.

as shown in FIG. 21, the liquid crystal display panel provided by the embodiment of the present disclosure includes: the array substrate described above and a color filter substrate, which are arranged opposite to each other; and a liquid crystal layer 09 between the array substrate and the color filter substrate. The liquid crystal layer 09 may include positive liquid crystal molecules or negative liquid crystal molecules.

In some implementations, in the liquid crystal display panel provided by the embodiment of the present disclosure, as shown in FIG. 21, the color filter substrate includes a black matrix 10, or the array substrate includes a black matrix 10 located on a side of the pixel electrode (for example, the first electrode 04) facing the liquid crystal layer 09; at least a part of the orthographic projection of the second part P2 on a layer where the liquid crystal display panel is located is within an orthographic projection of the black matrix 10 on the layer where the liquid crystal display panel is located. The second parts P2 disconnected are located below the black matrix 10, so that the occurrence of the black area in the effective display area can be effectively reduced, and the display effect can be further improved.

In practices, a line width of the black matrix 10 may be designed as desired. In consideration of influences such as shielding, crosstalk, and the like, of the data lines 03 made of a metal material, in the liquid crystal display panel provided by the embodiment of the present disclosure, a minimum value of the line width of the black matrix 10 may be designed to be $d_{BM}=d_{cell}+2\times d_{alignment}$, where $d_{cell}$ is a thickness of a cell of the liquid crystal display panel formed between the array substrate and the color filter substrate, and $d_{alignment}$ indicates an alignment accuracy between the array substrate and the color filter substrate of the liquid crystal display panel. For example, for the cell having a thickness of about 3.5 μm, and the alignment accuracy of a device in the process is about 3 μm, the line width of the black matrix 10 may be about 3.5 μm+2×3 μm=9.5 μm, and a position of a center line of the black matrix 10 coincides with a position of a center line of the data lines 03. In consideration of shielding effect on the disclination lines at the second side, the line width of the black matrix 10 may be increased appropriately, for example, the black matrix 10 at the second side may extend to cover a range extending inward from the farthest end of the second part P2 (i.e., the end of the second part P2 at the round angle) by 1 μm to 3 μm (i.e., may extend to completely cover the second part P2).

In addition, in the liquid crystal display panel provided by the embodiment of the present disclosure, as shown in FIG. 21, the array substrate generally further includes a lower polarizer 11; the color filter substrate further includes a second alignment layer 12, a glass substrate 13 and an upper polarizer 14. In some implementations, the pixel electrode may be disposed on the array substrate, and the common electrode may be disposed on the color filter substrate, which is not limited herein. As understood by those skilled in the art, other essential components of the liquid crystal display panel are included, and are not described herein and should not be construed as limiting the present disclosure.

Figure 22:
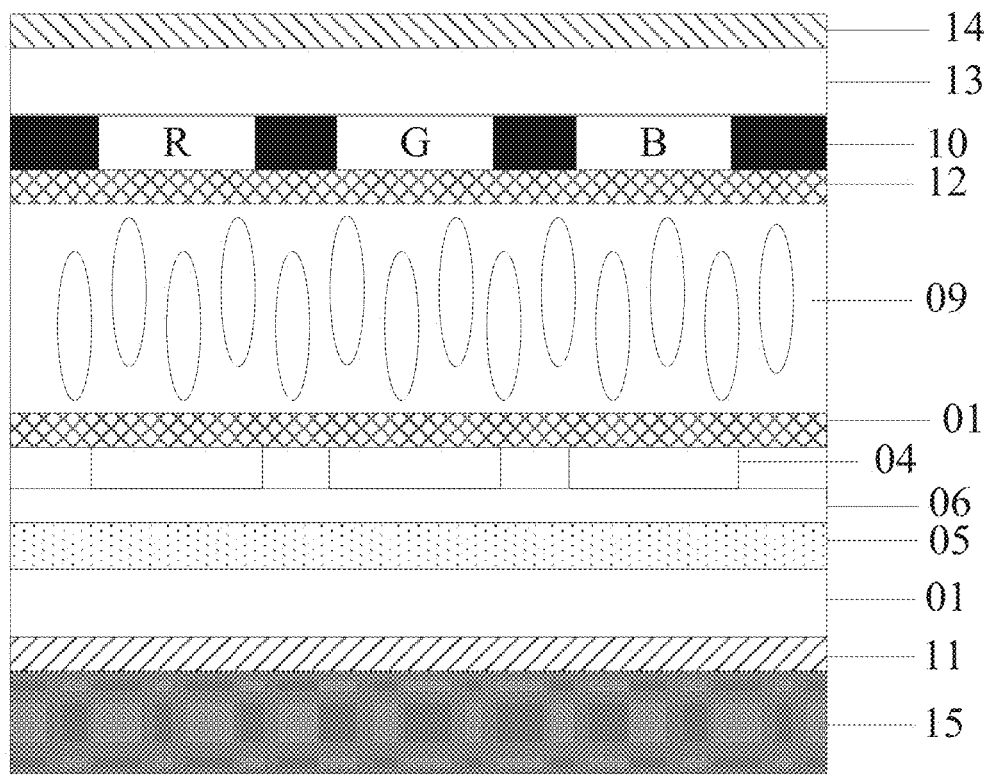
FIG. 22 is a schematic structural diagram of a liquid crystal display device according to an embodiment of the present disclosure.

In another aspect, an embodiment of the present disclosure further provides a liquid crystal display device, as shown in FIG. 22, including the liquid crystal display panel provided by the embodiment of the present disclosure, and a backlight module 15 located on a light incident side of the liquid crystal display panel. The backlight module 15 may be a direct type backlight module or a side type backlight module. The liquid crystal display device may be any product or component with a display function, such as a mobile phone, a tablet computer, a television, a display, a notebook computer, a digital photo frame, a navigator, an intelligent watch, a fitness wrist strap, and a personal digital assistant. As understood by those skilled in the art, other essential components of the liquid crystal display device are included, and are not described herein and should not be construed as limiting the present disclosure. In addition, since a principle of solving problems of the liquid crystal display device is similar to that of solving problems of the liquid crystal display panel described above, implementations of the liquid crystal display device may refer to the implementations of the liquid crystal display panel described above, and repeated descriptions are omitted.

The array substrate, the liquid crystal display panel and the liquid crystal display device provided by embodiments of the present disclosure each include: a base substrate; a plurality of gate lines each extending in a first direction on the base substrate; a plurality of data lines each extending in a second direction intersecting the first direction; a plurality of pixel units located in regions defined by the gate lines and the data lines, where each pixel unit has a first side and a second side each extending in the second direction and opposite to each other in the first direction; each pixel unit includes a first electrode, the first electrode includes a plurality of strip-shaped electrodes, at least part of the strip-shaped electrodes each have a first part and a second part extending in different directions, first parts are connected at the first side, second parts are disconnected at the second side, and lengths of the first part and the second part are different. By providing the second parts of at least part of the strip-shaped electrodes being disconnected at the second side, the component Ex of the electric field between the second parts (equivalent to edge parts of the strip-shaped electrodes) close to the second side and the common electrode is reduced, and therefore, the electric field between the strip-shaped electrodes as a whole and the common electrode is to be regarded as only including components Ez and Ey. In such case, the first electrode controls the corresponding liquid crystal molecules in the edge area and the middle area of the first electrode to substantially rotate to a same extent, thereby avoiding the occurrence of the black disclination lines, and improving the display effect.

It will be apparent to those skilled in the art that various modifications and variations may be made in the embodiments of the disclosure without departing from the spirit and scope of the present disclosure. Thus, if such modifications and variations of the embodiments of the present disclosure are within the scope of claims of the present disclosure and their equivalents, the present disclosure is intended to encompass such modifications and variations.

What is claimed is:

1. An array substrate, comprising:
a base substrate;
a plurality of gate lines each extending in a first direction on the base substrate;
a plurality of data lines each extending in a second direction intersecting the first direction;
a plurality of pixel units located in regions defined by the gate lines and the data lines,
wherein each pixel unit has a first side and a second side each extending in the second direction and opposite to each other in the first direction,
each pixel unit comprises a first electrode, the first electrode comprises a plurality of strip-shaped electrodes, at least part of the strip-shaped electrodes each have a first part and a second part extending in different directions, first parts are connected at the first side, second parts are disconnected at the second side, and lengths of the first part and the second part are different,
wherein each first part is in a shape of a straight line, and each second part is in a shape of a curved line that is curved away from the direction in which each first part extends.

2. The array substrate of claim 1, wherein an acute angle between the direction in which each first part extends and the direction in which each second part extends is greater than about 0° and less than or equal to about 45°.

3. The array substrate of claim 1,
at least a portion of the second parts have a same radian.

4. The array substrate of claim 1, wherein a line width of each first part is the same as a line width of each second part.

5. The array substrate of claim 1, wherein a farthest end of each second part away from the first part is of a round angle.

6. The array substrate of claim 1, wherein the strip-shaped electrodes each extend along a third direction and are arranged along a fourth direction intersecting the third direction;
the first electrode further comprises a connection electrode, the connection electrode comprises a first connection electrode, a second connection electrode and a third connection electrode, the first connection electrode and the second connection electrode each extend in the first direction and are arranged in the second direction, and the third connection electrode is connected to the first connection electrode and the second connection electrode at the first side;
each first part is connected to the first connection electrode or the third connection electrode; each strip-shaped electrode is connected between the second connection electrode and the third connection electrode and is not overlapped with the second side, and a length of an orthographic projection of each strip-shaped electrode in the first direction is less than a distance between the first side and the second side.

7. The array substrate of claim 1, wherein the strip-shaped electrodes comprises a plurality of first strip-shaped electrodes and a plurality of second strip-shaped electrodes, a direction in which the first strip-shaped electrodes each extend is different from a direction in which the second strip-shaped electrodes each extend.

8. The array substrate of claim 7, wherein the first strip-shaped electrodes and the second strip-shaped electrodes are symmetrical with respect to the first direction.

9. The array substrate of claim 8, wherein an included angle between the first strip-shaped electrodes and the second strip-shaped electrodes is greater than or equal to about 80° and less than or equal to about 100°, or an included angle between the first strip-shaped electrodes and the second strip-shaped electrodes is greater than about 0° and less than or equal to about 10°.

10. The array substrate of claim 8, wherein each of the second parts is bent toward a side away from a symmetry axis of the first strip-shaped electrodes and the second strip-shaped electrodes, or each of the second parts is bent toward a side close to a symmetry axis of the first strip-shaped electrodes and the second strip-shaped electrodes.

11. The array substrate of claim 10, wherein a distance between each strip-shaped electrode and the symmetry axis gradually decreases from an end of the strip-shaped electrode close to the first side to an end of the strip-shaped electrode close to the second side.

12. The array substrate of claim 11, wherein the first electrode further comprises a connection electrode, the connection electrode comprises a first connection electrode, a second connection electrode and a third connection electrode, the first connection electrode and the second connection electrode each extend in the first direction and are arranged in the second direction, and the third connection electrode is connected to the first connection electrode and the second connection electrode at the first side, and
wherein for the first strip-shaped electrodes and the second strip-shaped electrodes having orthographic projections each with a length in the first direction less than a distance between the first side and the second side and not overlapping with the second side, ends of the first strip-shaped electrode and the second strip-shaped electrode symmetrical with respect to a perpendicular bisector of the third connection electrode are connected, and another ends of the first strip-shaped electrode and the second strip-shaped electrode are connected to the third connection electrode;

the first part of each first strip-shaped electrode is connected to the first connection electrode or the third connection electrode, and the first part of each second strip-shaped electrode is connected to the second connection electrode or the third connection electrode.

13. The array substrate of claim 10, wherein a distance between each strip-shaped electrode and the symmetry axis gradually increases from an end of the strip-shaped electrode close to the first side to an end of the strip-shaped electrode close to the second side.

14. The array substrate of claim 13, wherein the first electrode further comprises a connection electrode, the connection electrode comprises a first connection electrode, a second connection electrode, a third connection electrode and a fourth connection electrode, the first connection electrode, the fourth connection electrode and the second connection electrode each extend in the first direction and are arranged in the second direction, and the third connection electrode is connected to the first connection electrode, the fourth connection electrode and the second connection electrode at the first side, and wherein for the first strip-shaped electrodes and the second strip-shaped electrodes having orthographic projections each with a length in the first direction less than a distance between the first side and the second side and not overlapping the second side, each first strip-shaped electrode is connected between the first connection electrode and the third connection electrode, and each second strip-shaped electrode is connected between the second connection electrode and the third connection electrode;

the first part of each first strip-shaped electrode is connected to the third connection electrode or the fourth connection electrode; the first part of each second strip-shaped electrode is connected to the third connection electrode or the fourth connection electrode.

15. The array substrate of claim 1, wherein each pixel unit further comprises a second electrode between the first electrode and the base substrate or on a side of the first electrode away from the base substrate, and the second electrode is a planar electrode.

16. The array substrate of claim 15, wherein an orthographic projection of the first electrode on the base substrate is within an orthographic projection of the second electrode on the base substrate, and wherein a distance between a boundary of the orthographic projection of the second electrode on the base substrate and an orthographic projection of the data line adjacent to the second electrode on the base substrate is less than a distance between a boundary of the orthographic projection of the first electrode on the base substrate and an orthographic projection of the data line adjacent to the first electrode on the base substrate.

17. The array substrate of claim 1, further comprising a first alignment layer on a side, of a layer where the pixel units are located, the side of the layer where the pixel units are located is away from the base substrate, and an alignment direction of the first alignment layer is configured to be in a direction from the first side to the second side.

18. A liquid crystal display panel, comprising:
the array substrate of claim 1 and a color filter substrate arranged opposite to each other; and
a liquid crystal layer between the array substrate and the color filter substrate.

19. The liquid crystal display panel of claim 18, wherein the color filter substrate comprises a black matrix, or the array substrate comprises a black matrix on a side of the pixel electrode facing the liquid crystal layer;

at least part of an orthographic projection of each second part on a layer where the liquid crystal display panel is located is within an orthographic projection of the black matrix on the layer where the liquid crystal display panel is located.

20. The liquid crystal display panel of claim 19, wherein a line width $d_{BM}$ of the black matrix satisfies a following relation:

$$d_{BM} = d_{cell} + 2 \times d_{assignment},$$

$d_{cell}$ is a thickness of a cell of the liquid crystal display panel formed between the array substrate and the color filter substrate, $d_{alignment}$ indicates an alignment accuracy between the array substrate and the color filter substrate of the liquid crystal display panel.

* * * * *